United States Patent
Huang et al.

(10) Patent No.: US 12,412,858 B2
(45) Date of Patent: Sep. 9, 2025

(54) SEMICONDUCTOR DEVICE STRUCTURE WITH CONDUCTIVE BUMPS

(71) Applicant: Taiwan Semiconductor Manufacturing Company, Ltd., Hsinchu (TW)

(72) Inventors: Hui-Min Huang, Taoyuan (TW); Ming-Da Cheng, Taoyuan (TW); Wei-Hung Lin, Xinfeng Township, Hsinchu County (TW); Chang-Jung Hsueh, Taipei (TW); Kai-Jun Zhan, Taoyuan (TW); Yung-Sheng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/635,274

(22) Filed: Apr. 15, 2024

(65) Prior Publication Data
US 2024/0258259 A1 Aug. 1, 2024

Related U.S. Application Data

(63) Continuation of application No. 17/459,174, filed on Aug. 27, 2021, now Pat. No. 11,990,440.

(51) Int. Cl.
*H01L 23/00* (2006.01)
(52) U.S. Cl.
CPC .............. *H01L 24/14* (2013.01); *H01L 24/06* (2013.01); *H01L 24/11* (2013.01); *H01L 24/13* (2013.01);
(Continued)
(58) Field of Classification Search
CPC ....................................................... H01L 24/14
See application file for complete search history.

(56) References Cited

U.S. PATENT DOCUMENTS 5,729,894 A * 3/1998 Rostoker ............... H01L 23/544
29/841
5,883,435 A * 3/1999 Geffken .................. H01L 24/10
257/737

(Continued)

FOREIGN PATENT DOCUMENTS

TW 201324718 A 6/2013
TW I567908 B 1/2017
TW I719670 B 2/2021

OTHER PUBLICATIONS

Chinese language office action dated Nov. 2, 2022, issued in application No. TW 111110336.

*Primary Examiner* — William A Harriston
(74) *Attorney, Agent, or Firm* — McClure, Qualey & Rodack, LLP

(57) ABSTRACT

A semiconductor device structure is provided. The semiconductor device structure includes a semiconductor substrate and a first conductive structure over the semiconductor substrate. The first conductive structure has a first protruding portion extending towards the semiconductor substrate from a lower surface of the first conductive structure. The semiconductor device structure also includes a second conductive structure over the semiconductor substrate. The second conductive structure is substantially as wide as the first conductive structure, and the second conductive structure has a second protruding portion extending towards the semiconductor substrate from a lower surface of the second conductive structure. The first conductive structure is closer to a center point of the semiconductor substrate than the second conductive structure. The second protruding portion is wider than the first protruding portion, and bottoms of the first protruding portion and the second protruding portion are substantially level with each other.

20 Claims, 16 Drawing Sheets

(52) U.S. Cl.
CPC ...... *H01L 24/16* (2013.01); *H01L 2224/0221* (2013.01); *H01L 2224/0401* (2013.01); *H01L 2224/1147* (2013.01); *H01L 2224/13018* (2013.01); *H01L 2224/14051* (2013.01); *H01L 2224/16227* (2013.01)

(56) References Cited

U.S. PATENT DOCUMENTS

| | | | |
|---|---|---|---|
| 9,000,584 B2 | 4/2015 | Lin | |
| 9,048,222 B2 | 6/2015 | Hung | |
| 9,048,233 B2 | 6/2015 | Wu | |
| 9,064,879 B2 | 6/2015 | Hung | |
| 9,111,949 B2 | 8/2015 | Yu | |
| 9,263,511 B2 | 2/2016 | Yu | |
| 9,281,254 B2 | 3/2016 | Yu | |
| 9,368,460 B2 | 6/2016 | Yu | |
| 9,372,206 B2 | 6/2016 | Wu | |
| 9,496,189 B2 | 11/2016 | Yu | |
| 9,570,366 B2 | 2/2017 | Jeng | |
| 9,978,705 B2 | 5/2018 | Liao | |
| 10,490,468 B2 * | 11/2019 | Tsai | H01L 21/4853 |
| 11,083,086 B2 * | 8/2021 | Wu | H05K 3/4644 |
| 11,855,017 B2 * | 12/2023 | Yang | H01L 24/14 |
| 2011/0186986 A1 * | 8/2011 | Chuang | H01L 24/05 257/737 |
| 2011/0248398 A1 * | 10/2011 | Parvarandeh | H01L 24/11 257/737 |
| 2013/0284499 A1 * | 10/2013 | Imafuji | H05K 3/244 174/250 |
| 2013/0292827 A1 * | 11/2013 | Kuo | H01L 24/11 257/737 |
| 2014/0061897 A1 * | 3/2014 | Lin | H01L 24/17 257/737 |
| 2016/0322323 A1 * | 11/2016 | Lai | H01L 24/14 |
| 2021/0091026 A1 * | 3/2021 | Jang | H01L 24/13 |

* cited by examiner

US 12,412,858 B2

SEMICONDUCTOR DEVICE STRUCTURE WITH CONDUCTIVE BUMPS

PRIORITY CLAIM AND CROSS-REFERENCE

This Application is a Continuation of U.S. application Ser. No. 17/459,174, filed on Aug. 27, 2021 (now U.S. Pat. No. 11,990,440), the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
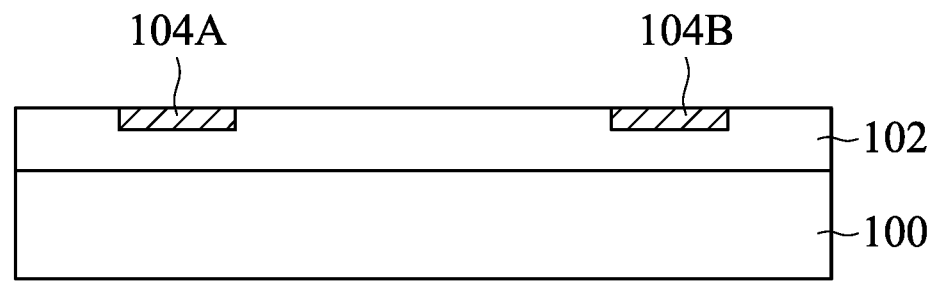
FIGS. 1A-1J are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to chip package, such as three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The via area of one peripheral conductive pillar (one opening area of the insulating layer) is larger than via area of one central conductive pillar. The larger via area may help to reduce the stress near the corner conductive pillars and/or help to sustain the warpage stress. Cracks and/or delamination are thus prevented or reduced.

FIGS. 1A-1J are cross-sectional views of various stages of a process for forming a portion of a semiconductor device structure, in accordance with some embodiments. As shown in FIG. 1A, a semiconductor substrate 100 is provided. In some embodiments, the semiconductor substrate 100 is defined to mean a construction comprising one or more semiconductor materials. In some embodiments, the semiconductor substrate 100 includes a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

In some embodiments, the semiconductor substrate 100 includes isolation features (not shown). The isolation features may define and isolate various device elements (not shown) formed in and/or on the semiconductor substrate 100. The isolation features include shallow trench isolation (STI) features, local oxidation of silicon (LOCOS) features, other suitable isolation features, or a combination thereof.

Examples of the various device elements, which may be formed in and/or on the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, one or more other suitable elements, or a combination thereof.

Various processes are performed to form the various device elements, which include, for example, deposition, photolithography, etching, implantation, annealing, planarization, and/or other applicable processes. In some embodiments, the various device elements are interconnected to form an integrated circuit device. The integrated circuit device includes, for example, a logic device, a memory device (such as static random access memory (SRAM) and/or dynamic static random access memory (DRAM)), radio frequency (RF) device, input/output (I/O) device, system-on-chip (SoC) device, other applicable devices, or a combination thereof.

As shown in FIG. 1A, an interconnection structure 102 is formed over the semiconductor substrate 100, in accordance with some embodiments. The interconnection structure 102 includes multiple dielectric layers and various conductive features surrounded by the dielectric layers. The conductive features include, for example, multiple horizontal interconnects, such as conductive lines, and multiple vertical interconnects, such as conductive vias and conductive contacts. The conductive features form conductive paths between the device elements (not shown) formed in and/or on the semiconductor substrate 100. The formation of the interconnection structure 102 may involve multiple deposition processes, multiple patterning processes, and multiple planarization processes.

Some of the conductive features of the interconnection structure 102 are shown in FIG. 1A. As shown in FIG. 1A, conductive features 104A and 104B that may function as top metal layers are illustrated. The conductive features 104A and 104B are used to provide electrical connections to conductive pillars that will be formed over the conductive features 104A and 104B later. The conductive features 104A and 104B may be made of or include copper, aluminum, gold, one or more other suitable materials, or a combination thereof. In some embodiments, the conductive feature 104B is formed over an outer region (or an edge region) of the semiconductor substrate 100, and the conductive feature 104A is formed over an inner region of the semiconductor substrate 100. The conductive feature 104B is closer to an edge of the semiconductor substrate 100. The conductive feature 104A is closer to the center portion (or the center point) of the semiconductor substrate 100 than the conductive feature 104B.

Figure 1B:
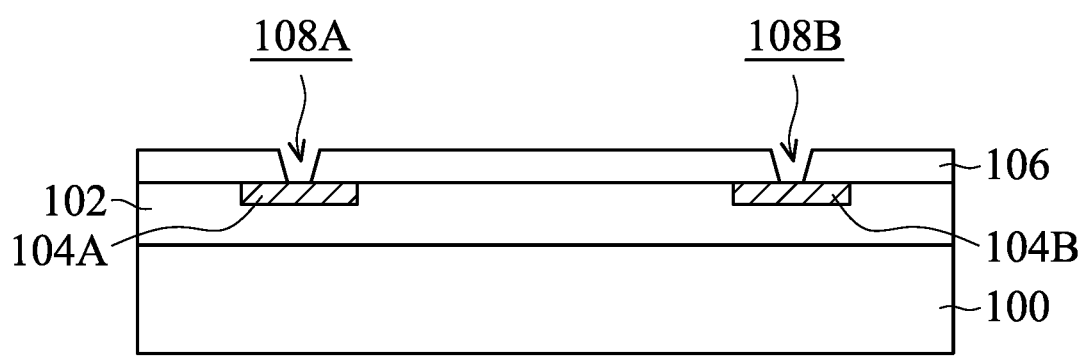

As shown in FIG. 1B, a passivation layer 106 is formed over the interconnection structure 102, in accordance with some embodiments. The passivation layer 106 may be used to protect the interconnection structure 102. The passivation layer 106 may be made of a dielectric material. The dielectric material may be made of or include silicon nitride, silicon oxynitride, silicon carbide, one or more other suitable materials, or a combination thereof. Alternatively, the passivation layer 106 may be made of or include an organic material. The organic material may include polyimide (PI), polybenzoxazole (PBO), benzocyclobutene (BCB), one or more other suitable materials, or a combination thereof. The organic material may be photosensitive. The passivation layer 106 may be formed using a chemical vapor deposition (CVD) process, a physical vapor deposition (PVD) process, a spin coating process, one or more other applicable processes, or a combination thereof.

As shown in FIG. 1B, the passivation layer 106 is partially removed to form openings 108A and 108B, in accordance with some embodiments. The openings 108A and 108B expose the conductive features 104A and 104B, respectively. In some embodiments where the passivation layer 106 is made of a dielectric layer such as silicon nitride or silicon oxynitride, the openings 108A and 108B is formed using a photolithography process and an etching process. In some other embodiments where the passivation layer 106 is made of a photosensitive polymer material such as PI or PBO, the openings 108A and 108B is formed using a photolithography process.

Figure 1C:
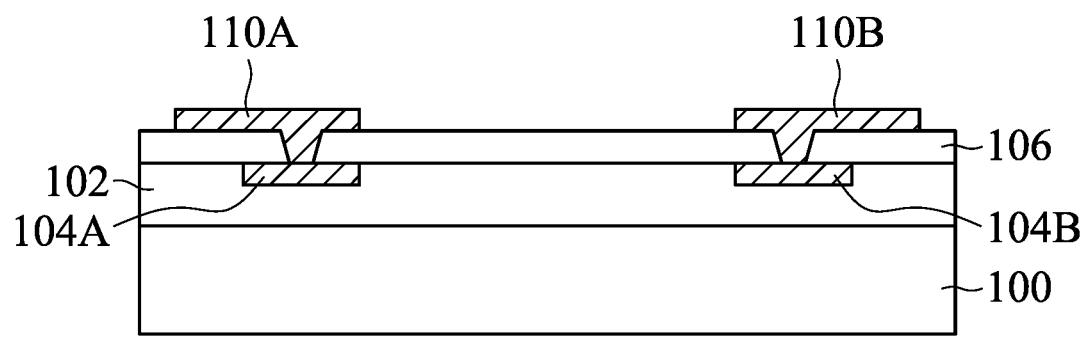

As shown in FIG. 1C, conductive features 110A and 110B are formed, in accordance with some embodiments. The conductive features 110A and 110B extend into the openings 108A and 108B to form respective electrical connections to the conductive features 104A and 104B, as shown in FIG. 1C. The conductive features 110A and 110B may be made of or include copper, aluminum, gold, cobalt, titanium, one or more other suitable materials, or a combination thereof. The conductive features 110A and 110B may be formed using an electroplating process, an electroless plating process, a CVD process, a PVD process, one or more other applicable processes, or a combination thereof. The formation of the conductive features 110A and 110B may further involve one or more patterning processes and/or one or more etching processes.

Figure 1D:
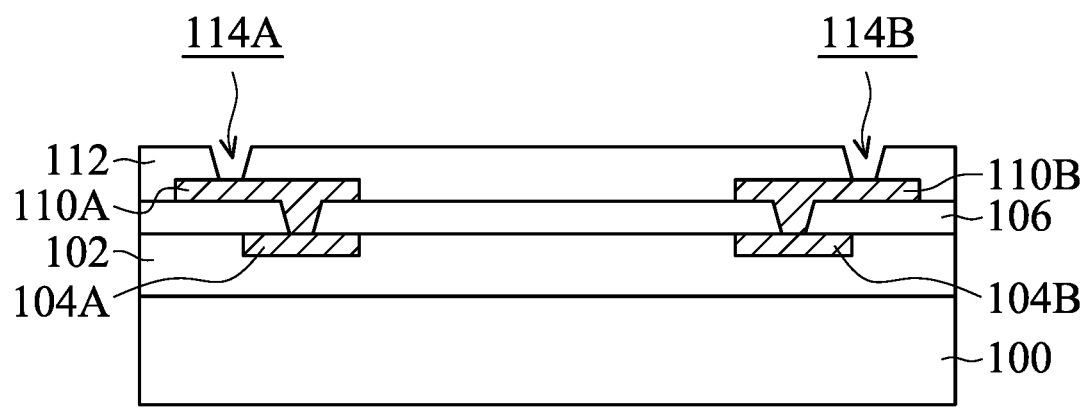

As shown in FIG. 1D, an insulating layer 112 is formed over the passivation layer 106 and the conductive features 110A and 110B, in accordance with some embodiments. The material and formation method of the insulating layer 112 may be the same as or similar to those of the passivation layer 106. For example, the insulating layer 112 is made of or include PI, PBO, one or more other suitable materials, or a combination thereof.

As shown in FIG. 1D, the insulating layer 112 is partially removed to form openings 114A and 114B, in accordance with some embodiments. The openings 114A and 114B expose the conductive features 110A and 110B, respectively. In some embodiments, the openings 114A and 114B are misaligned with the openings 108A and 108B previously formed in the passivation layer 106. The misalignment arrangement of the upper openings and the lower openings may help to reduce stress applied on the conductive vias that are formed in these openings.

In some embodiments, the insulating layer 112 is made of a photosensitive polymer material. In these cases, the openings 114A and 114B may be formed using a photolithography processes. In some other embodiments, the insulating layer 112 is made of a dielectric material such as silicon nitride, silicon oxynitride, and/or silicon oxide. In these cases, the openings 114A and 114B may be formed using a photolithography process and an etching process.

Figure 1E:
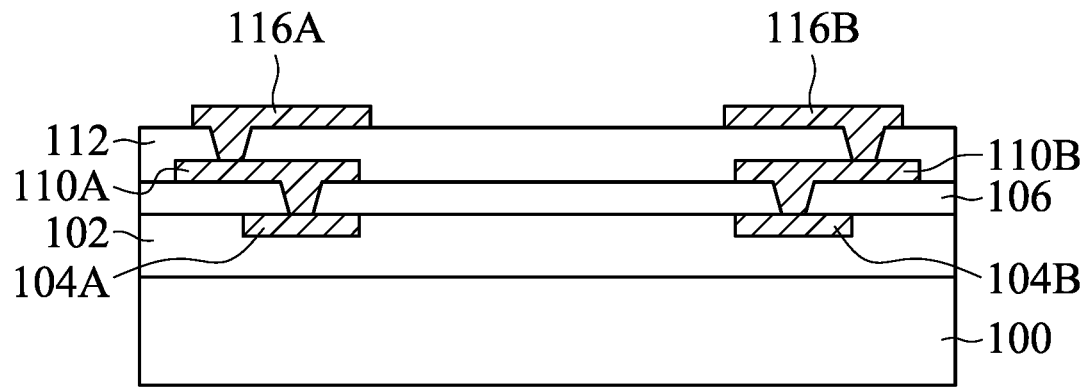

As shown in FIG. 1E, conductive features 116A and 116B are formed over the conductive features 110A and 110B, in accordance with some embodiments. The conductive features 116A and 116B respectively extend into the openings 114A and 114B to form respective electrical connections to the conductive features 110A and 110B, as shown in FIG. 1E. The conductive features 116A and 116B may function as conductive pads that are used to receive or hold conductive bumps that will be formed later. The material and formation method of the conductive features 116A and 116B may be the same as or similar to those of the conductive features 110A and 110B. In some embodiments, the conductive features 116A and 116B are substantially as wide as each other. In some other embodiments, the conductive feature 116B is wider than the conductive feature 116A. The conductive feature 116B (that is wider) may have a greater strength to sustain higher stress at the edge region.

The conductive features 116A and 116B are electrically connected to the conductive features 104A and 104B, respectively. The conductive features 110A and 110B may be used for routing. The electrical path may thus be redistributed. In some other embodiments, more levels of conductive features may be formed for routing. In some other embodiments, the conductive features 116A and 116B are formed directly on the conductive features 104A and 104B. In some cases, no other conductive feature is formed between the conductive feature 104A (or 104B) and the conductive feature 116A (or 116B) that may function as a conductive pad.

As shown in FIG. 1E, the portion of the conductive feature 110A filling the
opening 108A forms a lower conductive via, and the portion of the conductive feature 116A filling the opening 114A forms an upper conductive via. In some embodiments, the lower conductive via is misaligned with the upper conductive via. In a subsequent bonding process, the applied bonding force may thus be prevented from being concentrated at the conductive vias. The reliability and performance of the semiconductor device structure are improved.

Figure 1F:
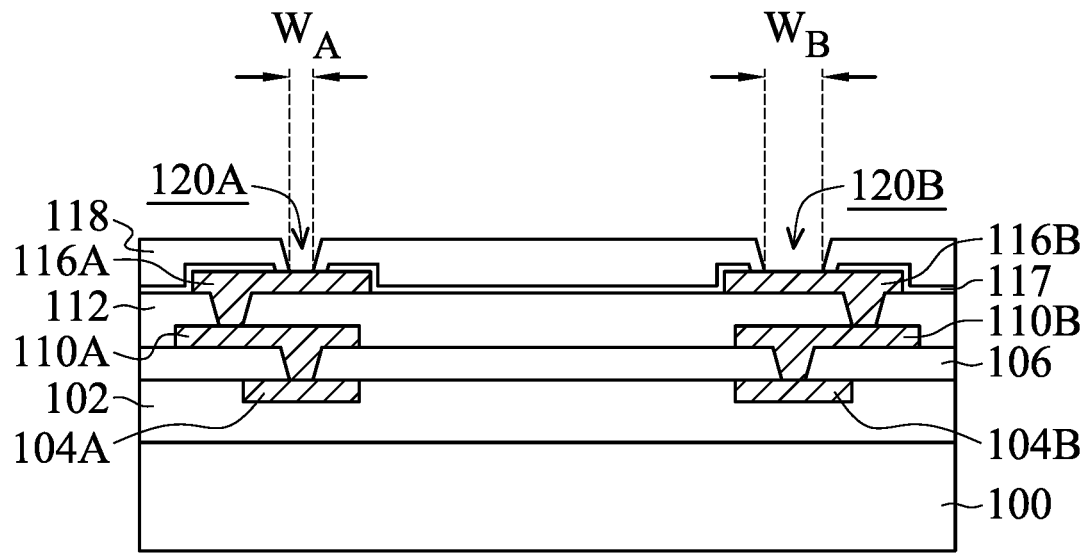

As shown in FIG. 1F, a patterned protection layer 117 is formed over the insulating layer 112 and the conductive features 116A and 116B, in accordance with some embodiments. The patterned protection layer 117 has openings that partially expose the conductive features 116A and 116B thereunder. The material and formation method of the protection layer 117 may be the same as or similar to those of the passivation layer 106.

However, embodiments of the disclosure are not limited thereto. Many variations and/or modifications can be made to embodiments of the disclosure. In some other embodiments, the protection layer 117 is not formed.

As shown in FIG. 1F, an insulating layer 118 is formed over the protection layer 117 and the conductive features 116A and 116B, in accordance with some embodiments. The material and formation method of the insulating layer 118 may be the same as or similar to those of the insulating layer 112.

Afterwards, the insulating layer 118 is partially removed to form openings 120A and 120B, as shown in FIG. 1F in accordance with some embodiments. The openings 120A and 120B expose the conductive features 116A and 116B, respectively. The top views of the openings 120A and 120B may have circular profiles, oval profiles, rectangular profiles, square profiles, or the like. The formation of the openings 120A and 120B may be the same as or similar to the openings 114A and 114B as illustrated in FIG. 1D. In some embodiments, the openings 120A and 120B are formed simultaneously. For example, a photolithography process is used to form the openings 120A and 120B at the same time. In some other embodiments, the openings 120A and 120B are formed separately using separate patterning processes.

In some embodiments, the opening 120B is wider than the opening 120A, as shown in FIG. 1F. Therefore, the exposed area of the conductive feature 116B is larger than the exposed area of the conductive feature 116A. As shown in FIG. 1F, the exposed area of the conductive feature 116A has a width $W_A$, and the exposed area of the conductive feature 116B has a width $W_B$. The width $W_A$ may be in a range from about 10 nm to about 100 μm. The width $W_B$ may be in a range from about 10 nm to about 450 μm. The ratio ($W_A/W_B$) of the width $W_A$ to the width $W_B$ may be in a range from about 0.01 to about 1. In some embodiments, the width $W_B$ is greater than the width $W_A$. In some other embodiments, the ratio ($W_A/W_B$) of the width $W_A$ to the width $W_B$ is in a range from about 0.05 to about 0.95.

Figure 1G:
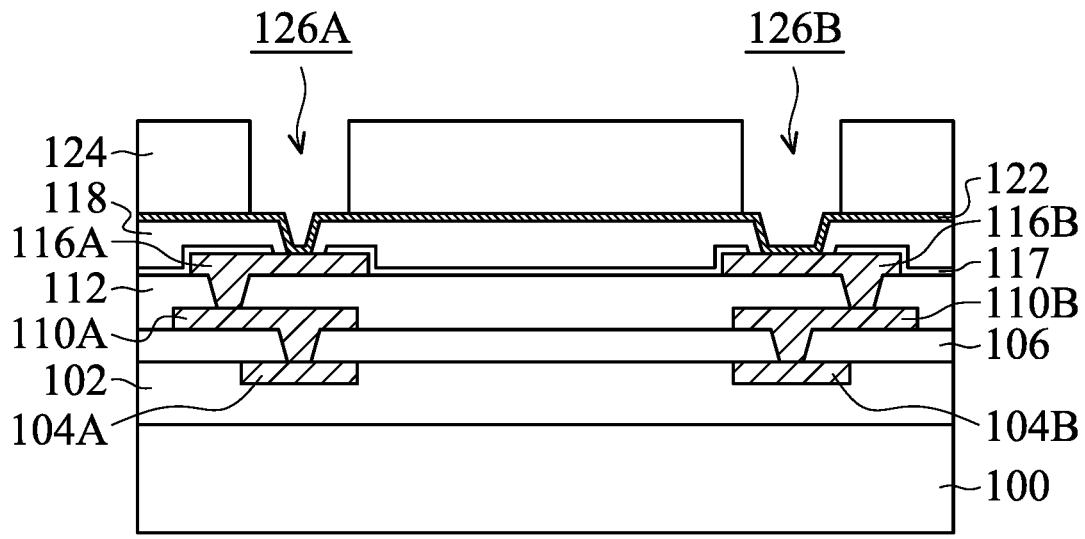

As shown in FIG. 1G, an under-bump metallization (UBM) layer 122 is deposited over the insulating layer 118 and the conductive features 116A and 116B, in accordance with some embodiments. In some embodiments, the UBM layer 122 is a single layer or a stack of multiple layers. For example, the UBM layer 122 may be made of or include Ti, TiW, TiCu, Ni, Cu, one or more other suitable materials, or a combination thereof. In some embodiments, the UBM layer 122 includes sub-layers including, for example, a glue layer (or a diffusion barrier layer) and a seed layer.

In some embodiments, the glue layer is made of or includes titanium nitride (TiN), titanium (Ti), tantalum (Ta), tantalum nitride (TaN), one or more other suitable materials, or a combination thereof. In some embodiments, the seed layer is a copper-containing seed layer formed on the glue layer. The copper-containing seed layer may be made of or include pure copper or one of many copper alloys that include silver, chromium, nickel, tin, gold, one or more other suitable elements, or a combination thereof.

In some embodiments, the UBM layer 122 is deposited by using a physical vapor deposition (PVD) process (including, for example, a sputtering process or an evaporation process), a chemical vapor deposition (CVD) process, an atomic layer deposition (ALD) process, an electroless plating process, one or more other applicable processes, or a combination thereof.

Afterwards, a mask layer 124 is formed over the UBM layer 122, as shown in FIG. 1G in accordance with some embodiments. The mask layer 124 is used to define the positions where conductive bumps (such as conductive pillars) will be formed later. In some embodiments, the mask layer 124 is a photoresist layer, a dry film, one or more other suitable films, or a combination thereof. In some embodiments, the mask layer 124 is deposited using a spin coating process, a spray coating process, a CVD process, an attachment process, one or more other applicable processes, or a combination thereof.

As shown in FIG. 1G, the mask layer 124 is patterned to form openings 126A and 126B. The opening 126A exposes a first portion of the UBM layer 122 above the conductive feature 116A, and the opening 126B exposes a second portion of the UBM layer 122 above the conductive feature 116B. The openings 126A and 126B may define the shapes and sizes of conductive pillars that will be formed in the openings 126A and 126B later. In some embodiments, the opening 126A is substantially as wide as the opening 126B, as shown in FIG. 1G. In some embodiments, the mask layer 124 is patterned using a photolithography process involving one or more masking, exposing, baking, developing, and rinsing processes (not necessarily in that order).

Figure 1H:
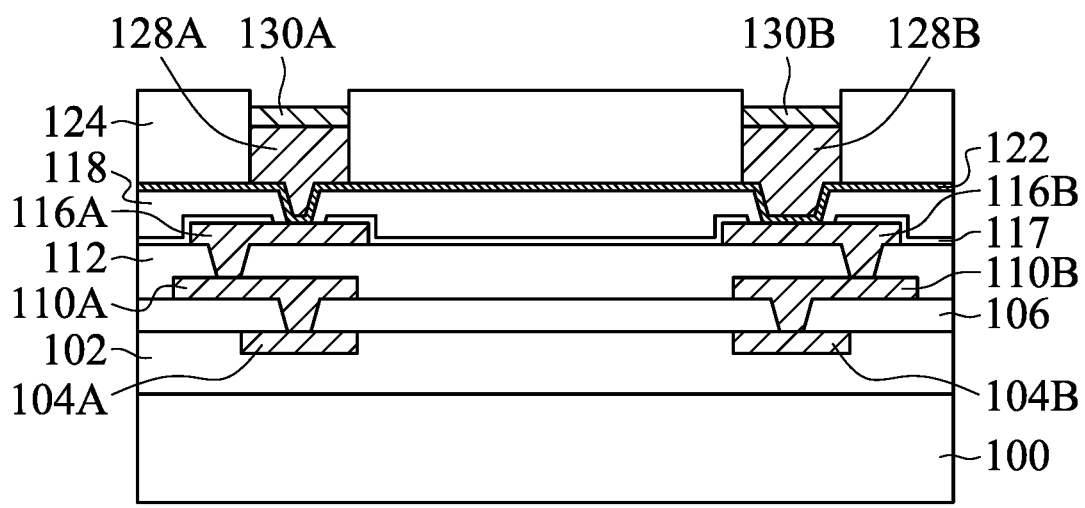

As shown in FIG. 1H, a conductive material is deposited over the UBM layer 122 exposed by the openings 126A and 126B of the mask layer 124, in accordance with some embodiments. The conductive material forms conductive pillars 128A and 128B, as shown in FIG. 1H. In some embodiments, the conductive pillar 128A is substantially as wide as the conductive pillar 128B.

In some embodiments, the conductive pillars 128A and 128B are made of or include copper (Cu), gold (Au), platinum (Pt), titanium (Ti), nickel (Ni), aluminum (Al), one or more other suitable materials, or a combination thereof. In some embodiments, the conductive pillars 128A and 128B are made of pure elemental copper, copper containing some impurities, or copper alloys containing minor amounts of other elements. For example, the copper alloys may contain tantalum, indium, tin, zinc, manganese, chromium, titanium, germanium, strontium, platinum, magnesium, aluminum, zirconium, one or more other suitable elements, or a combination thereof.

In some embodiments, the conductive pillars 128A and 128B are formed using an electroplating process, an electroless plating process, a CVD process, a PVD process, one or more other applicable processes, or a combination thereof. In some embodiments, the UBM layer 122 functions as an electroplating seed layer. A suitable conductive material, such as copper, is electroplated on the UBM layer 122 to form the conductive pillars 128A and 128B. In some embodiments, the conductive pillars 128A and 128B are formed simultaneously. In some other embodiments, the conductive pillars 128A and 128B are formed separately.

Afterwards, a solder material is formed over the conductive pillars 128A and 128B, as shown in FIG. 1H in accordance with some embodiments. The solder material forms solder elements 130A and 130B. In some embodiments, the solder elements 130A and 130B are in direct contact with the conductive pillars 128A and 128B, respectively. The solder elements 130A and 130B may be made of a tin-containing material. The tin-containing material may further include lead (Pb), silver (Ag), bismuth (Bi), copper (Cu), gold (Au), aluminum (Al), arsenic (As), iron (Fe), nickel (Ni), antimony (Sb), one or more other suitable materials, or a combination thereof. In some other embodiments, the solder elements 130A and 130B are lead-free. In some embodiments, the solder elements 130A and 130B are formed over the conductive pillars 128A and 128B using an electroplating process, an electroless plating process, a CVD process, a PVD process, one or more other applicable processes, or a combination thereof.

Many variations and/or modifications can be made to embodiments of the disclosure. In some embodiments, a barrier layer (not shown) is formed over the conductive pillars 128A and 128B before the solder elements 130A and 130B are formed. In these cases, the solder elements 130A and 130B may not be in direct contact with the conductive pillars 128A and 128B, respectively. The barrier layer may be used to prevent ions (such as copper ions) in the conductive pillars 128A and 128B from diffusing into the solder elements 130A and 130B. The prevention of ion diffusion (such as copper diffusion) may increase the reliability and bonding strength. In some embodiments, the barrier layer is made of or includes nickel (Ni), gold (Au), tin-lead (SnPb), silver (Ag), palladium (Pd), indium (In), nickel-palladium-gold (NiPdAu), nickel-gold (NiAu), one or more other suitable materials, or a combination thereof. In some embodiments, the barrier layer is formed using an electroplating process, an electroless plating process, a PVD process, a CVD process, one or more other applicable processes, or a combination thereof.

Figure 1I:
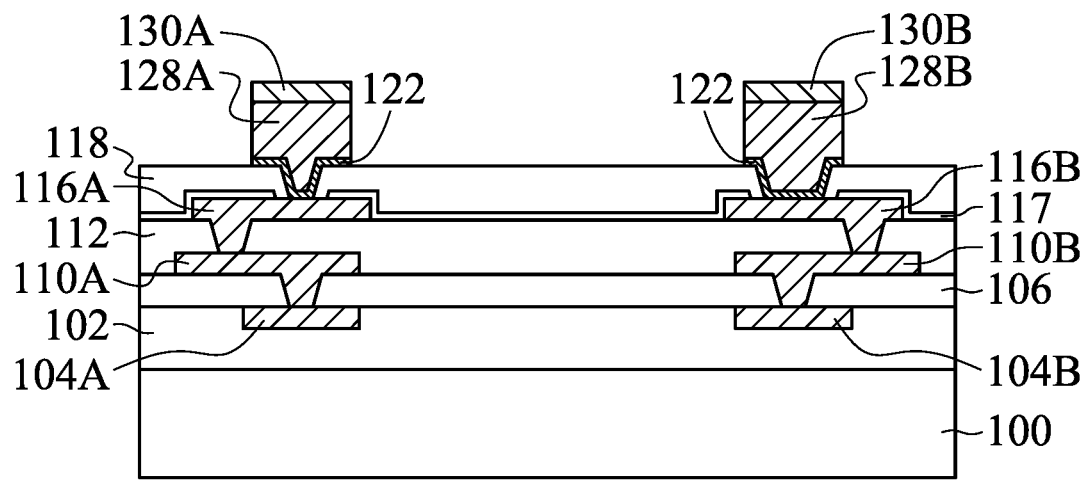

As shown in FIG. 1I, the mask layer 124 is removed, in accordance with some embodiments. In some embodiments, the mask layer 124 is removed using a stripping process, an ashing process, one or more other applicable processes, or a combination thereof.

As shown in FIG. 1I, the UBM layer 122 is then patterned, in accordance with some embodiments. In some embodiments, the UBM layer 122 is patterned using an etching process with the conductive pillars 128A and 128B and the solder elements 130A and 130B as an etching mask. The etching process may include a dry etching process, a wet etching process, or a combination thereof. After the etching process, the portions of the UBM layer 122 not covered by the etching mask are removed. As a result, the insulating layer 118 is exposed after the etching process. The patterning of the UBM layer 122 may help to prevent short circuiting between the conductive pillars 128A and 128B.

Figure 1J:
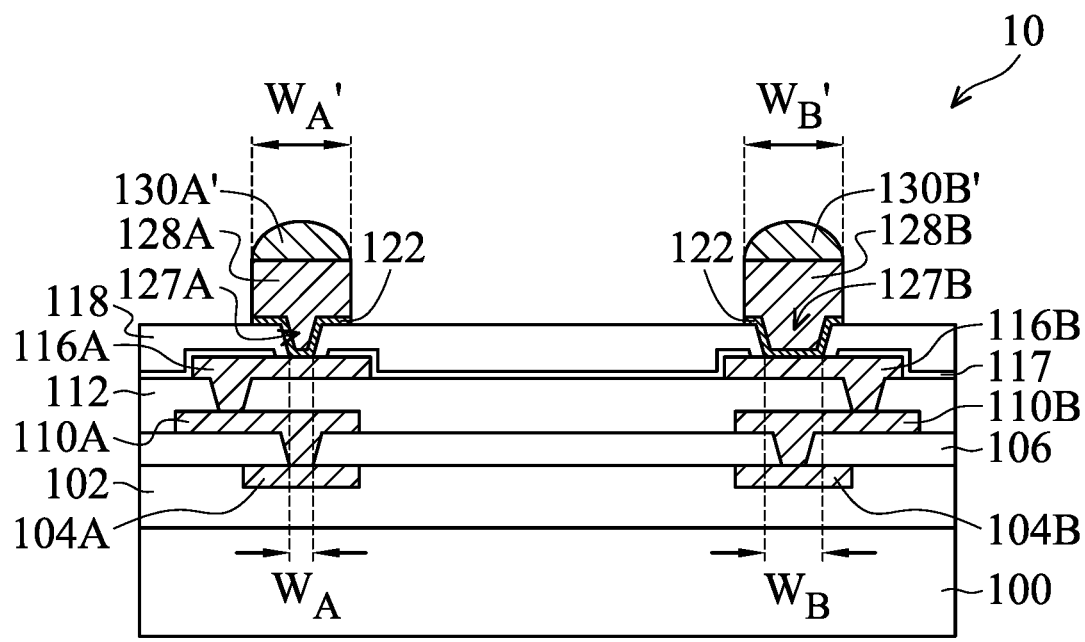

As shown in FIG. 1J, the solder elements 130A and 130B are reflowed to form solder bumps 130A' and 130B' over the conductive pillars 128A and 128B, in accordance with some embodiments. In some embodiments, the solder elements 130A and 130B are reflowed at a reflow temperature ranging from about 200 degrees C. to about 280 degrees C. In some embodiments, the solder bumps 130A' and 130B' have curved upper surfaces. The solder bump 130A' and the conductive pillar 128A may together function as a first conductive bump, and the solder bump 130B' and the conductive pillar 128B may together function as a second conductive bump.

In some embodiments, the semiconductor substrate 100 is a semiconductor wafer. In some embodiments, a dicing process is applied to separate the semiconductor substrate 100 (such as a semiconductor wafer) and the elements thereabove into multiple separated semiconductor chips (or semiconductor dies) 10. One of the semiconductor chips 10 is shown in FIG. 1J. In some embodiments, the semiconductor chip 10 is packaged in a package structure. Alternatively, in some other embodiments, the dicing process is not performed. In these cases, the entirety of the semiconductor substrate 100 (such as a semiconductor wafer) may be packaged in a package structure.

As shown in FIG. 1J, the conductive pillar 128A has a protruding portion 127A. The protruding portion 127A extends towards the semiconductor substrate 100 from a lower surface (such as the lower surface of the conductive pillar 128A extending over the top surface of the insulating layer 118) of the conductive pillar 128A. Similarly, the conductive pillar 128B has a protruding portion 127B. The protruding portion 127B extends towards the semiconductor substrate 100 from a lower surface (such as the lower surface of the conductive pillar 128B that extends over the top surface of the insulating layer 118) of the conductive pillar 128B. In some embodiments, the conductive pillars 128A and 128B have vertical sidewalls, and the protruding portions 127A and 127B have inclined sidewalls.

Figure 2:
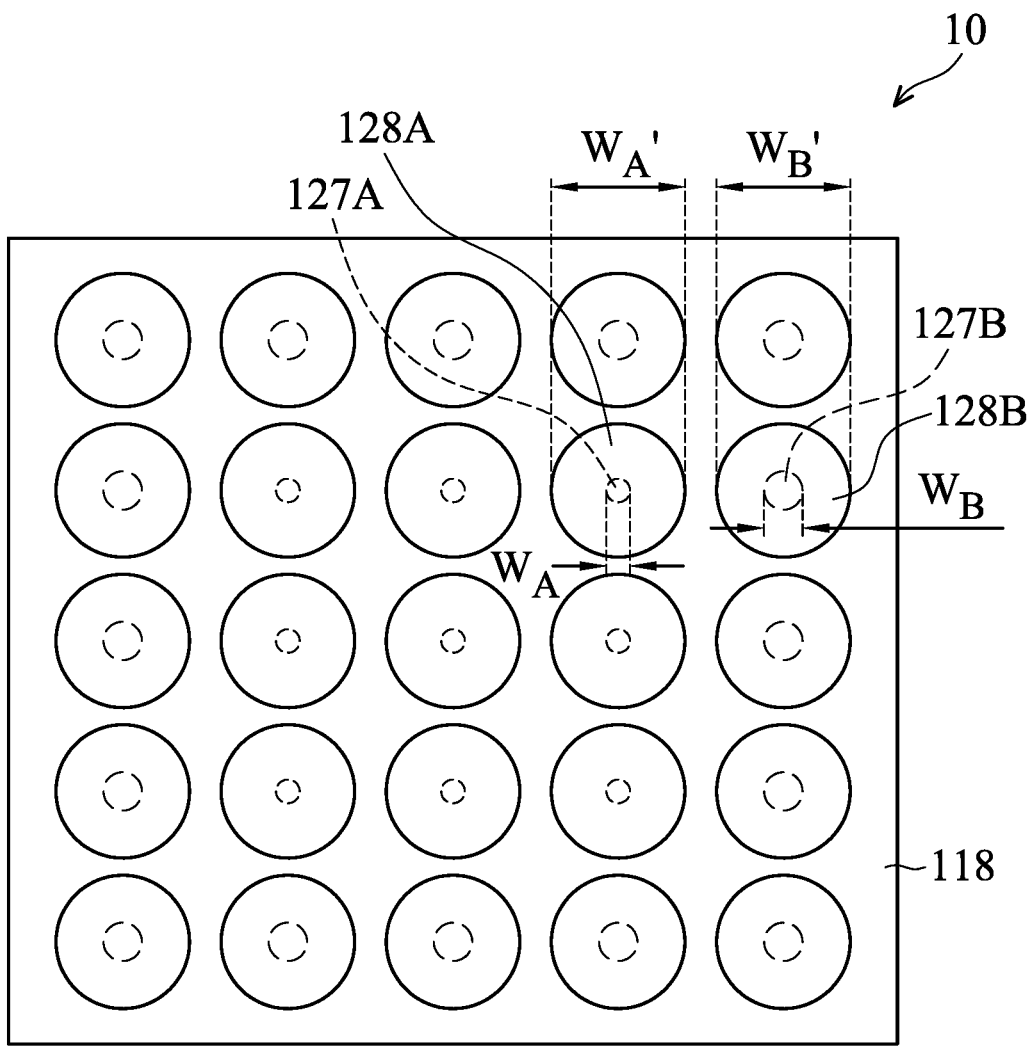
FIG. 2 is a plan view showing a portion of a semiconductor device structure, in accordance with some embodiments.

FIG. 2 is a plan view showing a portion of a semiconductor device structure, in accordance with some embodiments. In some embodiments, FIG. 2 shows a plan view of the semiconductor chip 10 shown in FIG. 1J. For clarity, the solder bumps 130A' and 130B' are not illustrated in FIG. 2. The profiles of the bottoms of the protruding portions 127A and 127B are illustrated using dashed lines in FIG. 2.

As shown in FIGS. 1J and 2, the conductive pillar 128A is closer to the center portion (or the center point) of the semiconductor substrate 100 than the conductive pillar 128B, in accordance with some embodiments. The conductive pillar 128B is positioned over an edge portion (or a corner portion) of the semiconductor substrate 100 of the semiconductor chip 10. In some cases, the edge portion means the region where one row of conductive pillars (that is adjacent to the edge of the semiconductor chip 10) are positioned. In some other cases, the edge portion means the region where two rows of conductive pillars (that are adjacent to the edge of the semiconductor chip 10) are positioned. As shown in FIGS. 1J and 2, the bottoms of the protruding portions 127A and 127B have the widths $W_A$ and $W_B$, respectively. In some embodiments, the width $W_B$ is greater than the width $W_A$. In some embodiments, the bottoms of the protruding portions 127A and 127B have circular profiles, as shown in FIG. 2.

As shown in FIGS. 1J and 2, the conductive pillars 128A and 128B have widths $W_A'$ and $W_B'$, respectively. In some embodiments, the widths $W_A'$ and $W_B'$ are the maximum widths of the conductive pillars 128A and 128B, respectively. In some embodiments, the width $W_A'$ is substantially equal to the width $W_B'$. In some embodiments, the top view of the conductive pillars 128A and 128B have circular profiles, as shown in FIG. 2.

In some embodiments, the available routing area at the edge portion of the semiconductor chip 10 is larger than that at the inner portion. Because the outer area or the edge portion of the semiconductor chip 10 has less "cross-line" requirement, more available space is provided to enlarge the opening 120B. As a result, the protruding portions 127B are allowed to be formed wider than the protruding portion 127A. Therefore, the interface area between the conductive pillar 128B and the conductive feature 116B is larger than the interface area between the conductive pillar 128A and the conductive feature 116A. The wider protruding portions 127B may help to reduce the stress near the conductive pillars 128B that are positioned at the edge portion (and/or the corner portion) of the semiconductor chip 10. Cracks and/or delamination are reduced or prevented from occurring near the conductive pillars 128B. The reliability and performance of the semiconductor device structure are greatly improved.

As mentioned above, in some embodiments, the ratio ($W_A/W_B$) of the width $W_A$ to the width $W_B$ may be in a range from about 0.01 to about 1 or in a range from about 0.05 to about 0.95. In some cases, if the ratio ($W_A/W_B$) is smaller than about 0.01 (or 0.05), the protruding portion 127B might be too wide. The routing of the conductive paths near the edge portion of the semiconductor chip 10 may become too challenging. In some other cases, if the ratio ($W_A/W_B$) is greater than about 1 (or 0.95), the protruding portion 127A might be too wide. The routing of the conductive paths near the inner portion of the semiconductor chip 10 may become too challenging. Alternatively, if the ratio ($W_A/W_B$) is greater than about 1 (or 0.95), the protruding portion 127B might not be wide enough to sustain a subsequent bonding process. The reliability and quality of the conductive pillar 128B might be negatively affected.

Figure 3:
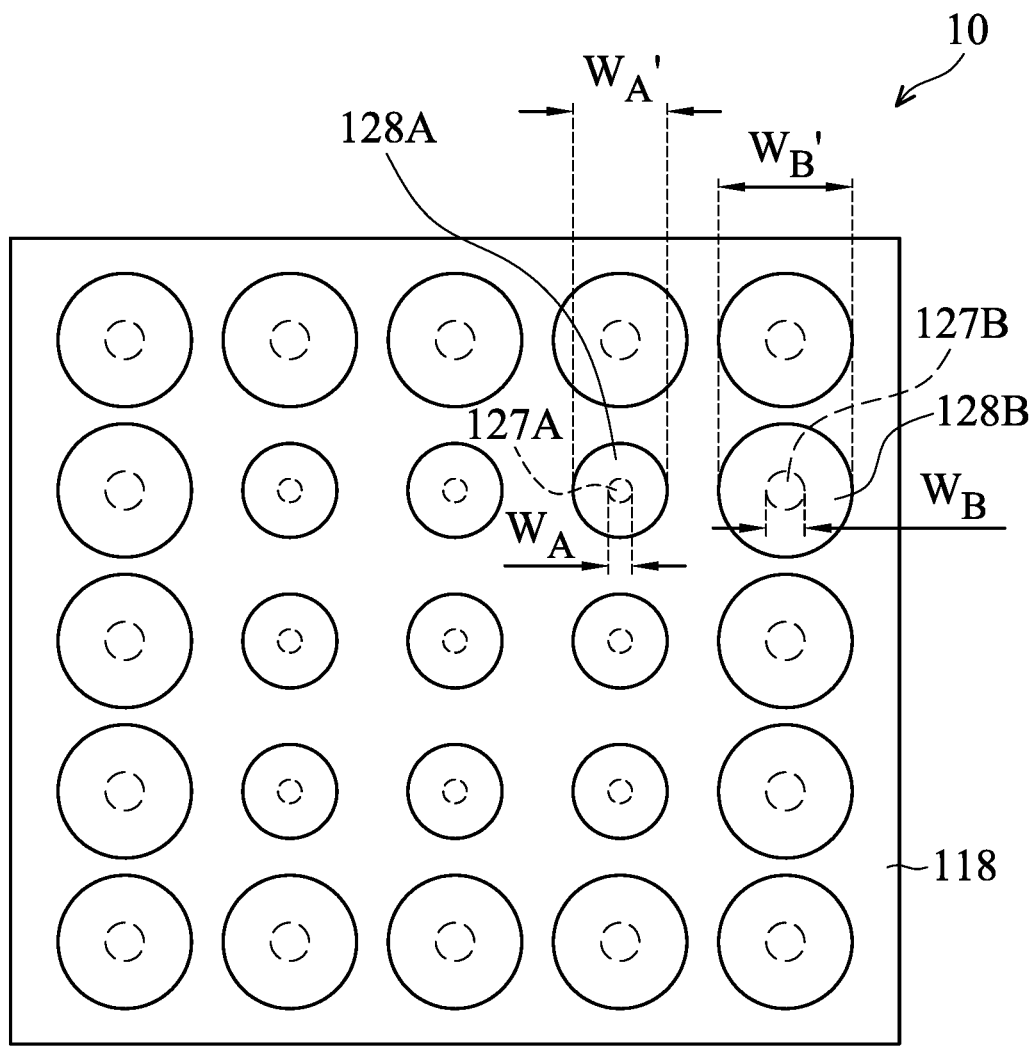
FIG. 3 is a plan view showing a portion of a semiconductor device structure, in accordance with some embodiments.

Many variations and/or modifications can be made to embodiments of the disclosure. FIG. 3 is a plan view showing a portion of a semiconductor device structure, in accordance with some embodiments. In some embodiments, FIG. 3 shows a top view of the semiconductor chip 10. In some embodiments, the conductive pillar 128B is not as wide as the conductive pillar 128A. In some embodiments, the conductive pillar 128B is wider than the conductive pillar 128A. The width $W_B'$ of the conductive pillar 128B is greater than the width $W_A'$ of the conductive pillar 128A. In some embodiments, by fine-tuning the shapes and sizes of the openings 126A and 126B as illustrated in FIG. 1G, the shapes and sizes of the conductive pillars 128A and 128B may be modified according to the requirements. The wider conductive pillar 128B may have greater strength to sustain a subsequent bonding process.

Figure 4:
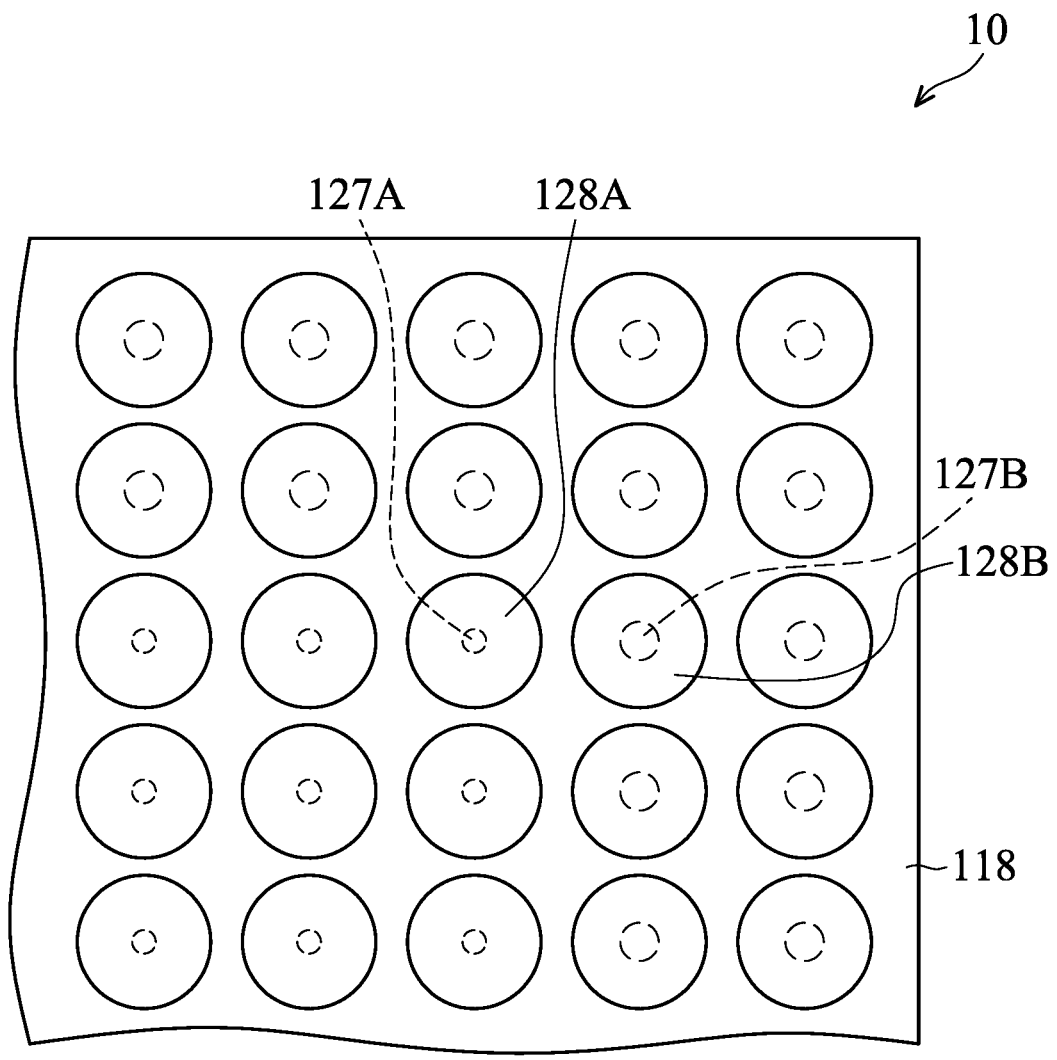
FIG. 4 is a plan view showing a portion of a semiconductor device structure, in accordance with some embodiments.

Many variations and/or modifications can be made to embodiments of the disclosure. FIG. 4 is a plan view showing a portion of a semiconductor device structure, in accordance with some embodiments. In some embodiments, FIG. 4 shows a top view of the semiconductor chip 10. In some embodiments, there are two or more rows of the conductive pillars 128B having the wider protruding portions 127B near the edge portion and/or corner portions of the semiconductor chip 10.

Figure 5:
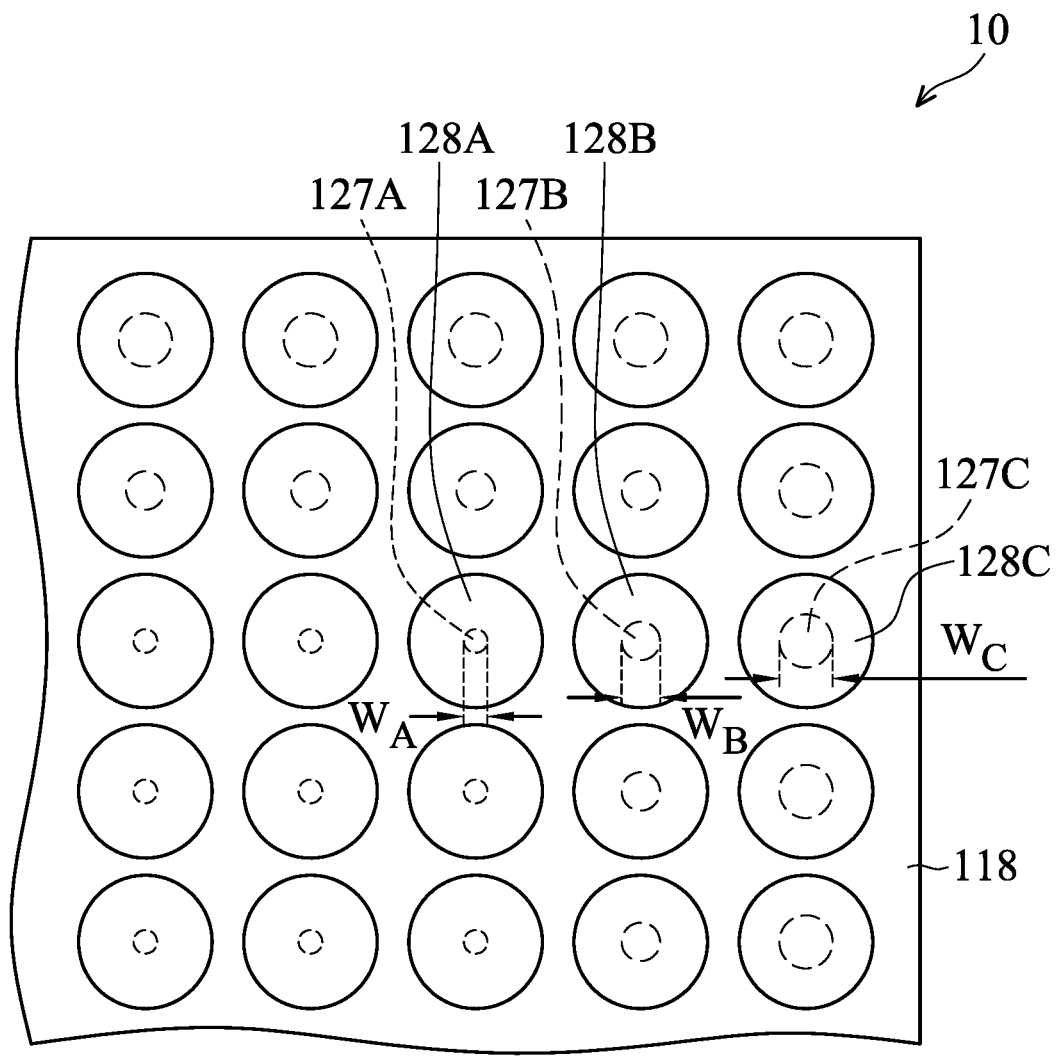
FIG. 5 is a plan view showing a portion of a semiconductor device structure, in accordance with some embodiments.

Many variations and/or modifications can be made to embodiments of the disclosure. FIG. 5 is a plan view showing a portion of a semiconductor device structure, in accordance with some embodiments. In some embodiments, FIG. 5 shows a top view of the semiconductor chip 10. In some embodiments, the semiconductor chip 10 further includes one or more conductive pillars 128C. In some embodiments, the conductive pillar 128B is between the conductive pillar 128A and 128C. The material and formation method of the conductive pillars 128C may be the same as or similar to those of the conductive pillars 128A and 128B. In some embodiments, the conductive pillar 128C is substantially as wide as the conductive pillar 128A or 128B, as shown in FIG. 5. In some embodiments, the top views of the conductive pillars 128A, 128B, and 128C have circular profiles.

In some embodiments, similar to the conductive pillars 128A and 128B, the conductive pillar 128C has a protruding portion 127C. Similar to the protruding portion 127A or 127B, the protruding portion 127C extends towards the semiconductor substrate 100 from a lower surface of the conductive pillar 128C. In some embodiments, the protruding portion 127C is wider than the protruding portion 127B, as shown in FIG. 5. As shown in FIG. 5, the bottom of the protruding portion 127C has a width $W_C$ that is greater than the width $W_B$ of the bottom of the protruding portion 127B.

Figure 6:
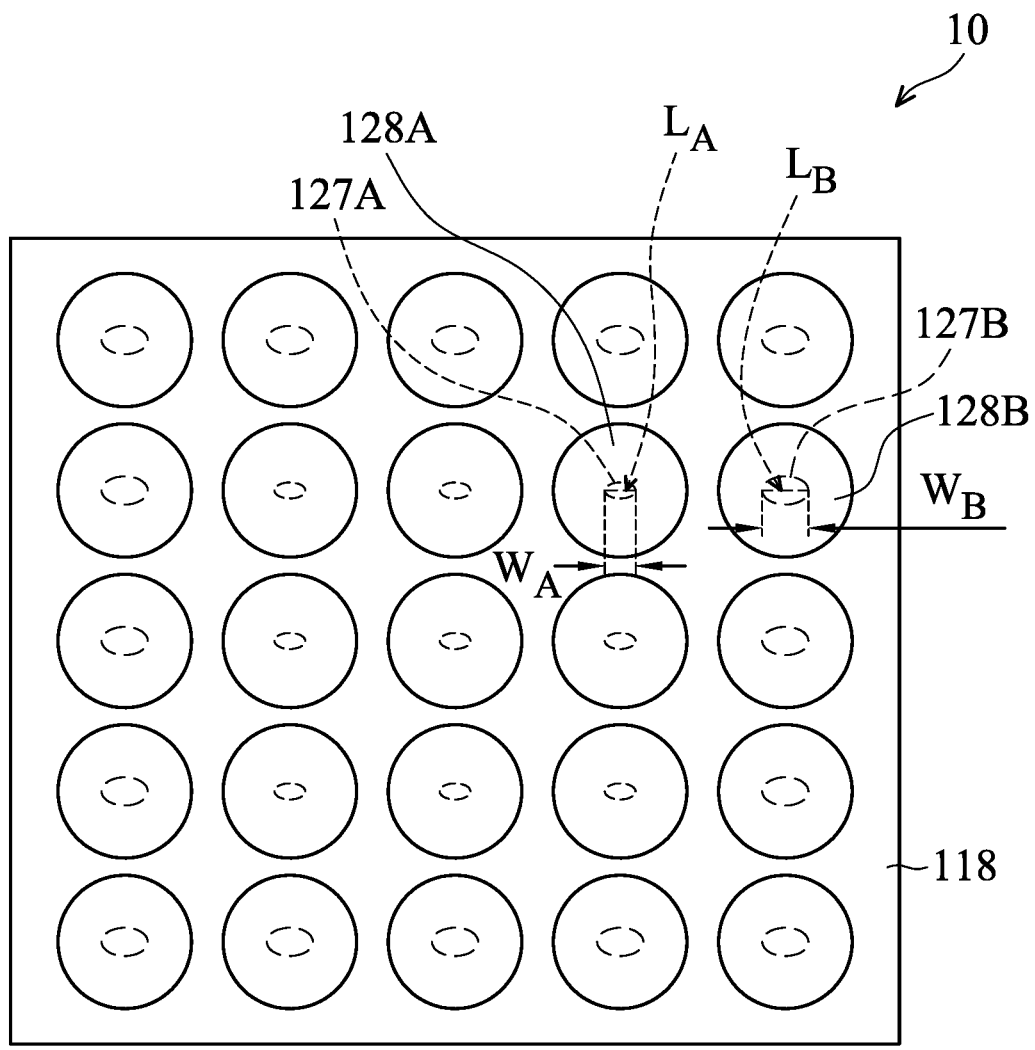
FIG. 6 is a plan view showing a portion of a semiconductor device structure, in accordance with some embodiments.

Many variations and/or modifications can be made to embodiments of the disclosure. FIG. 6 is a plan view showing a portion of a semiconductor device structure, in accordance with some embodiments. In some embodiments, FIG. 6 shows a top view of the semiconductor chip 10. In some embodiments, by fine-tuning the shapes and sizes of the openings 120A and 120B as illustrated in FIG. 1F, the shapes and sizes of the protruding portions 127A and 127B of the conductive pillars 128A and 128B may be modified according to the requirements.

As shown in FIG. 6, the bottoms of the protruding portions 127A and 127B have oval profiles, in accordance with some embodiments. As shown in FIG. 6, the bottom of the protruding portions 127A has a long axis $L_A$ with the width $W_A$. The bottom of the protruding portions 127B has a long axis $L_B$ with the width $W_B$. In some embodiments, the long axis $L_A$ is substantially parallel to the long axis $L_B$, as shown in FIG. 6.

Figure 7:
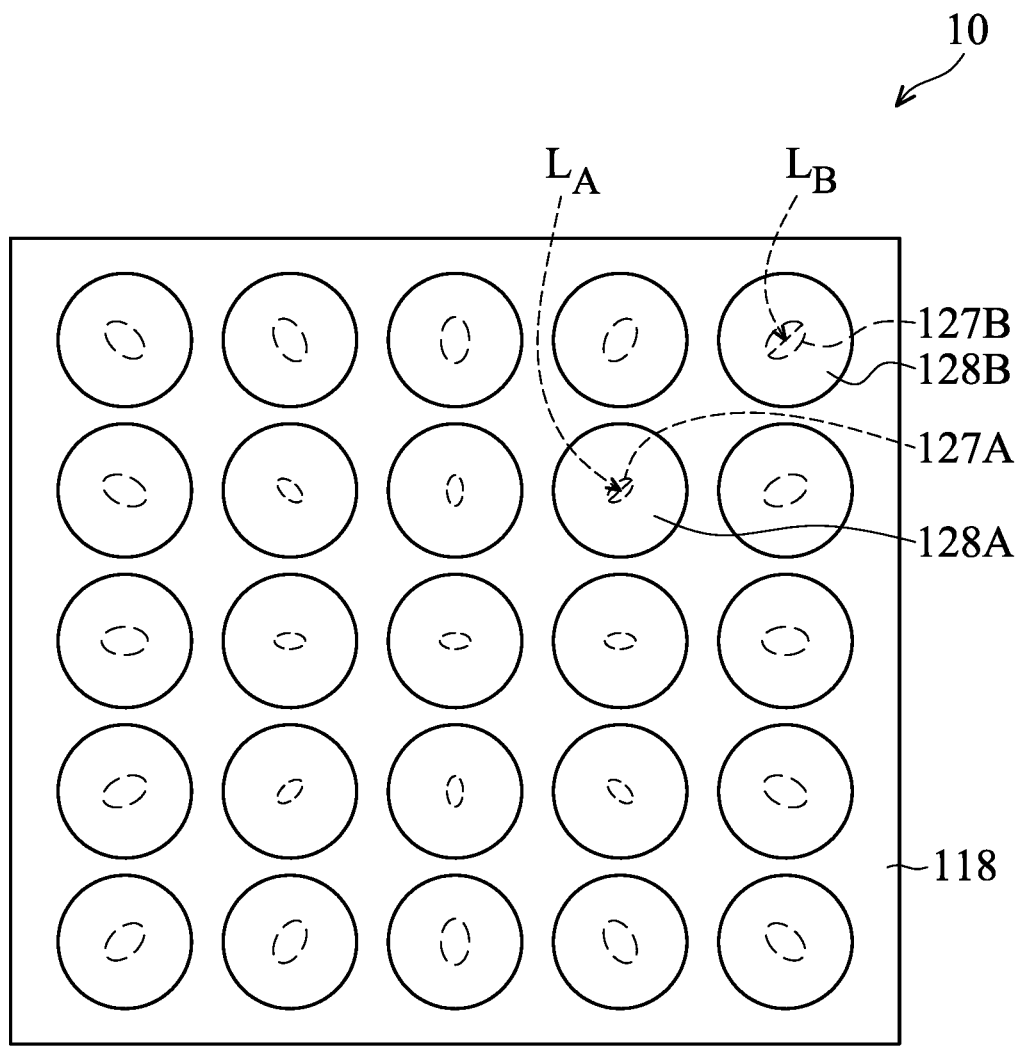
FIG. 7 is a plan view showing a portion of a semiconductor device structure, in accordance with some embodiments.

Many variations and/or modifications can be made to embodiments of the disclosure. FIG. 7 is a plan view showing a portion of a semiconductor device structure, in accordance with some embodiments. In some embodiments, FIG. 7 shows a top view of the semiconductor chip 10. In some embodiments, the long axis $L_A$ is not parallel to the long axis $L_B$. In some embodiments, the long axis $L_A$ and the long axis $L_B$ extend along different directions. In some embodiments, the long axis $L_A$ and the long axis $L_B$ extends along directions pointing to the center portion (or the center point) of the semiconductor chip 10. The long axis $L_A$ and the long axis $L_B$ are aligned with the center portion (or the center point) of the semiconductor chip 10, as shown in FIG. 7.

Figure 8:
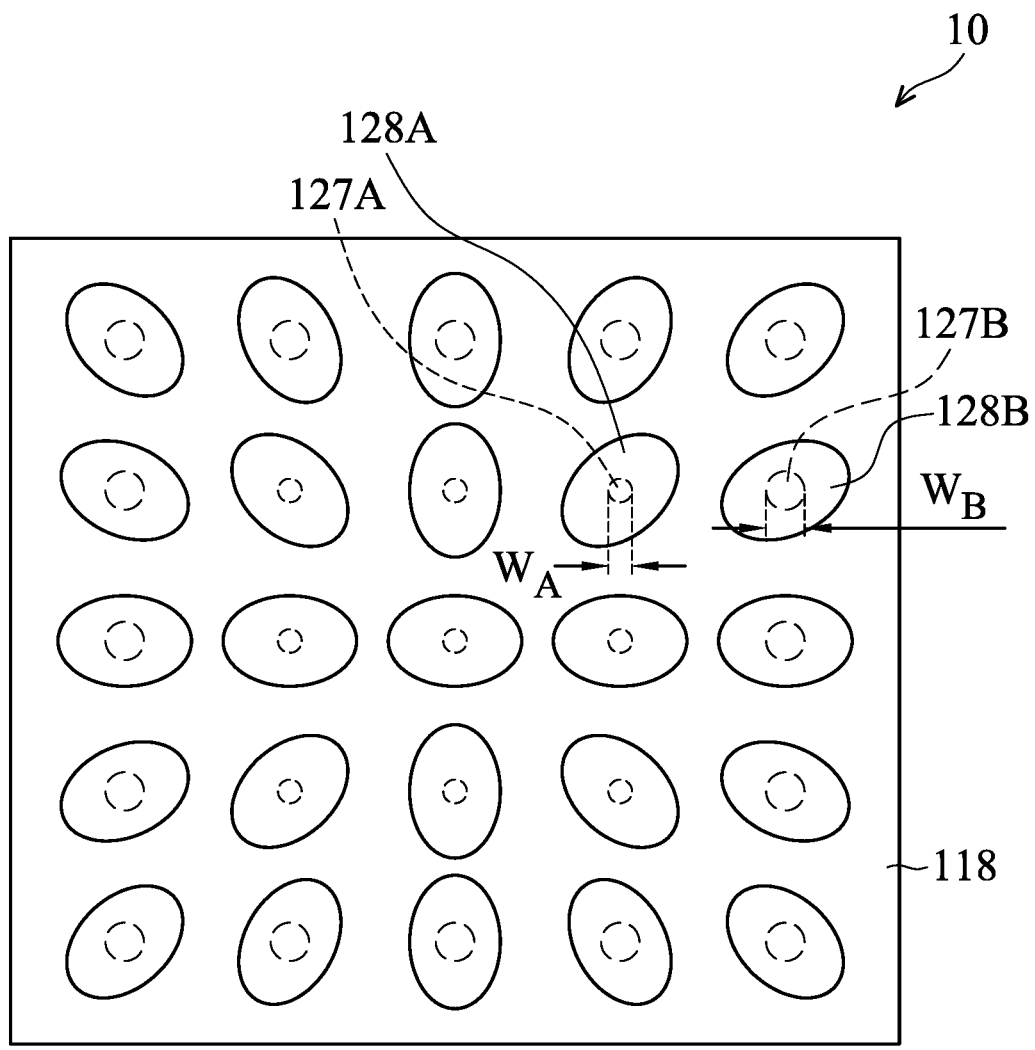
FIG. 8 is a plan view showing a portion of a semiconductor device structure, in accordance with some embodiments.

Many variations and/or modifications can be made to embodiments of the disclosure. FIG. 8 is a plan view showing a portion of a semiconductor device structure, in accordance with some embodiments. In some embodiments, FIG. 8 shows a top view of the semiconductor chip 10. In some embodiments, the top views of the conductive pillars 128A and 128B have oval profiles. The long axis of the top views of the conductive pillars 128A and 128B may be aligned with the center portion (or the center point) of the semiconductor chip 10, as shown in FIG. 8.

Figure 9:
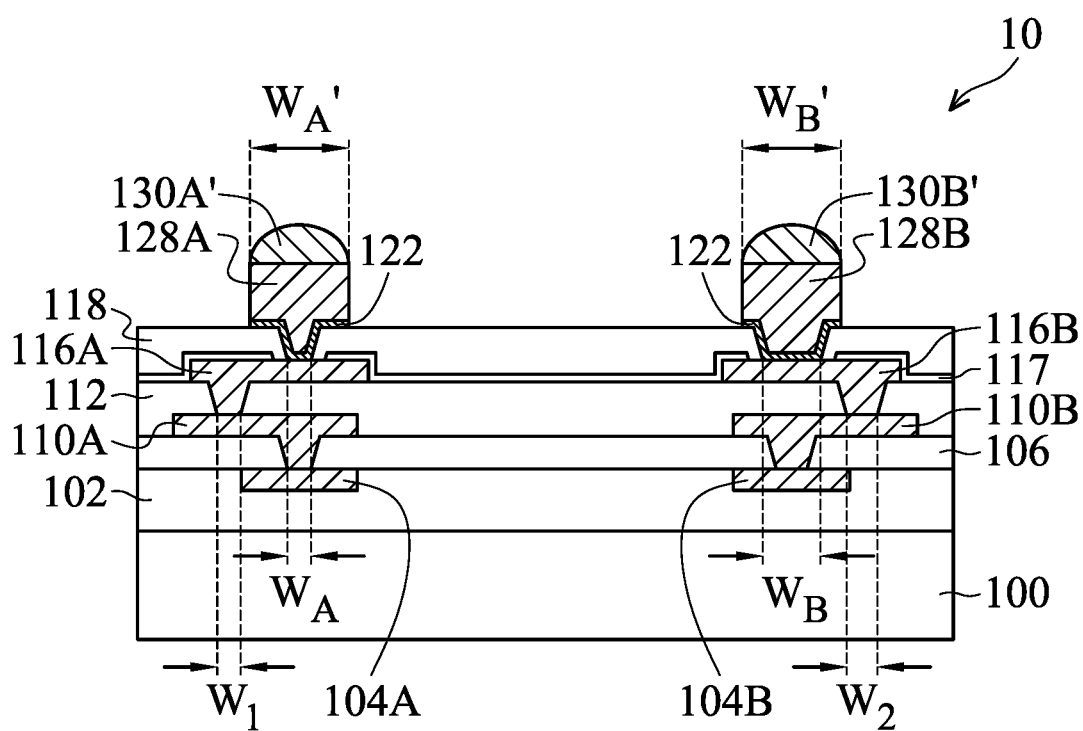
FIG. 9 is a cross-sectional view of a portion of a semiconductor device structure, in accordance with some embodiments.

Many variations and/or modifications can be made to embodiments of the disclosure. FIG. 9 is a cross-sectional view of a portion of a semiconductor device structure, in accordance with some embodiments. In some embodiments, a first conductive via (such as the conductive via with the width $W_1$) formed between the conductive pillar 128A and the semiconductor substrate 100 is narrower than a second conductive via (such as the conductive via with the width $W_2$) formed between the conductive pillar 128B and the semiconductor substrate 100. The wider conductive via near the edge portion and/or corner portion of the semiconductor substrate 100 may help to reduce the bonding stress during a subsequent bonding process. The performance and reliability of the semiconductor device structure may be improved.

Figure 10A:
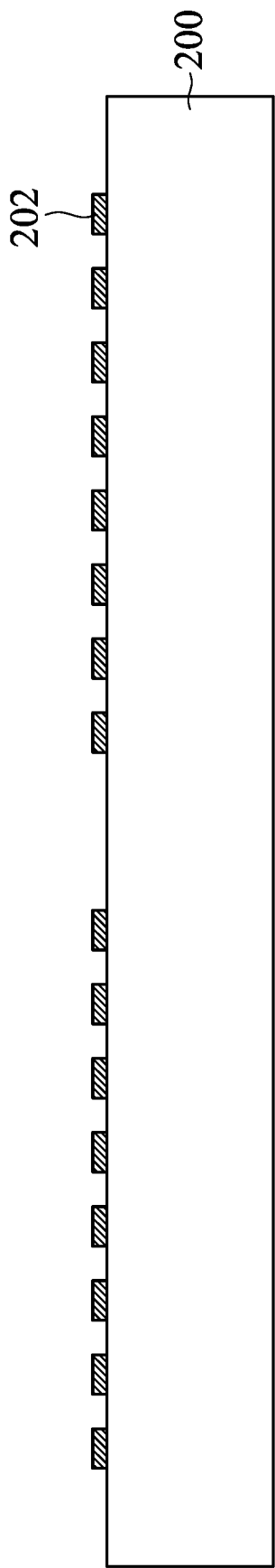
FIGS. 10A-10C are cross-sectional views of various stages of a process for forming a portion of a package structure, in accordance with some embodiments.
Figure 10B:
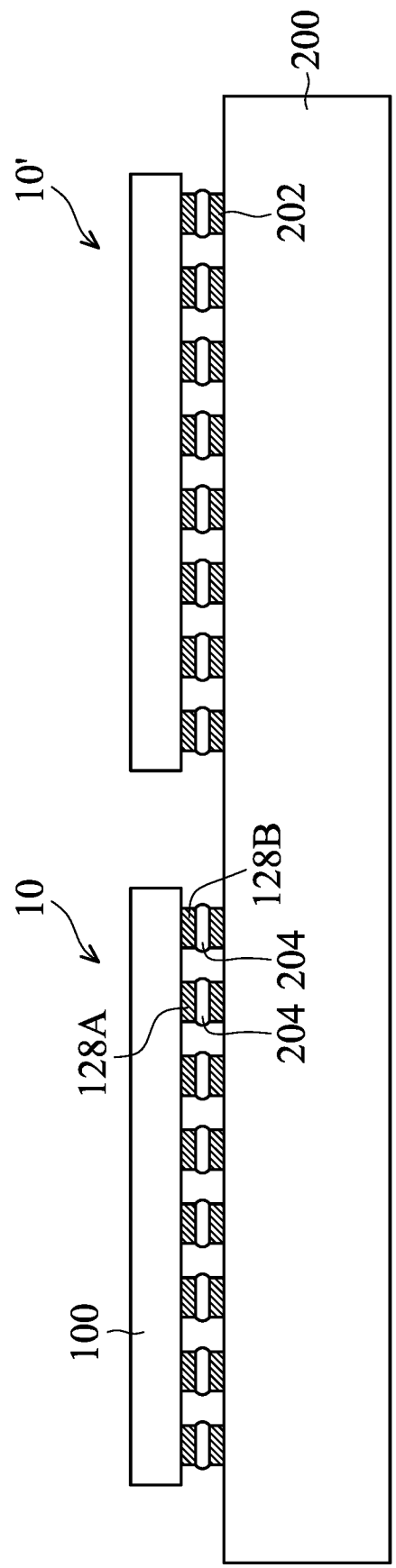
Figure 10C:
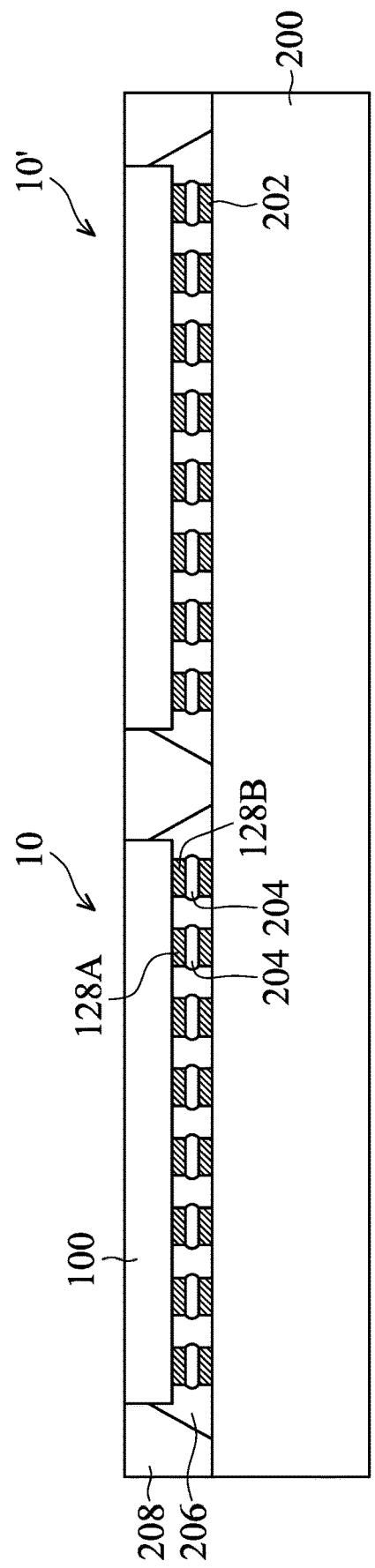

Many variations and/or modifications can be made to embodiments of the disclosure. The semiconductor chip 10 as illustrated in FIGS. 1J, 2, 3, 4, 5, 6, 7, 8, and/or 9 may be integrated into a package structure. FIGS. 10A-10C are cross-sectional views of various stages of a process for forming a portion of a package structure, in accordance with some embodiments.

As shown in FIG. 10A, a redistribution structure 200 is formed or provided, in accordance with some embodiments. The redistribution structure 200 may be a package substrate (such as a circuit board), an interposer substrate (such as a semiconductor interposer or a polymer interposer), an interconnection structure of a wafer, a polymer-containing interconnection structure formed over a carrier substrate, or the like. In some embodiments, the redistribution structure 200 includes conductive pads 202 that may be used to receive and hold one or more semiconductor chips.

As shown in FIG. 10B, semiconductor chips 10 and 10' are bonded to the conductive pads 202, in accordance with some embodiments. The semiconductor chips 10 and 10' may have the same or similar structures as illustrated in FIGS. 1J, 2, 3, 4, 5, 6, 7, 8, and/or 9. Before the bonding of the semiconductor chips 10 and 10', solder elements and/or flux materials may be formed over the conductive pads 202 to assist in the bonding process. The bonding elements over the conductive pads 202 may be reflowed together with the solder bumps 130A' and 130B' of the semiconductor chips 10 and 10'. As a result, solder bumps 204 are formed to affix the semiconductor chips 10 and 10' on the redistribution structure 200.

The bonding process mentioned above involves applying force between the redistribution structure 200 and the semiconductor chips 10 and 10'. Because the conductive pillars 128B have the wider protruding portions, the bonding stress near the conductive pillars 128B is significantly reduced. Cracks and/or delamination issues are thus prevented or reduced. The performance and reliability of the package structure are greatly improved.

As shown in FIG. 10C, an underfill material 206 is formed to surround and protect the conductive pillars 128A and 128B and the solder bumps 204, in accordance with some embodiments. The underfill material 206 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 208 is formed over the redistribution structure 200 to surround and protect the semiconductor chips 10 and 10', as shown in FIG. 10C in accordance with some embodiments. In some embodiments, the protective layer 208 is in physical contact with the redistribution structure 200.

However, embodiments of the disclosure are not limited thereto. Many variations and/or modifications can be made to embodiments of the disclosure. In some other embodiments, the underfill material 206 is not formed.

In some embodiments, the protective layer 208 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 208 is greater than the distribution density of the fillers in the underfill material 206. In some embodiments, the weight percentage of the fillers in the protective layer 208 is greater than the weight percentage of the fillers in the underfill material 206. The profiles, sizes, and/or materials of the fillers in the protective layer 208 and the underfill material 206 may be different from each other.

In some embodiments, a molding material (such as a liquid molding material) is introduced or injected to cover the redistribution structure 200 and the semiconductor chips 10 and 10'. In some embodiments, a thermal process is then used to cure the liquid molding material and to transform it into the protective layer 208. In some embodiments, a planarization process is performed to the protective layer 208 to improve the flatness of the protective layer 208. For example, the planarization process may include a grinding process, a CMP process, a dry polishing process, one or more other applicable processes, or a combination thereof. In some embodiments, after the planarization process, the top surface of the protective layer 208 is substantially level with the surfaces of the semiconductor chips 10 and 10'.

Because the conductive pillars formed at the edge portions (and/or the corner portions) of the semiconductor chips 10 and 10' have the wider protruding portions, these conductive pillars may have greater strength to sustain the bonding stress and/or the warpage stress. The reliability and quality of the package structure are improved.

Figure 11:
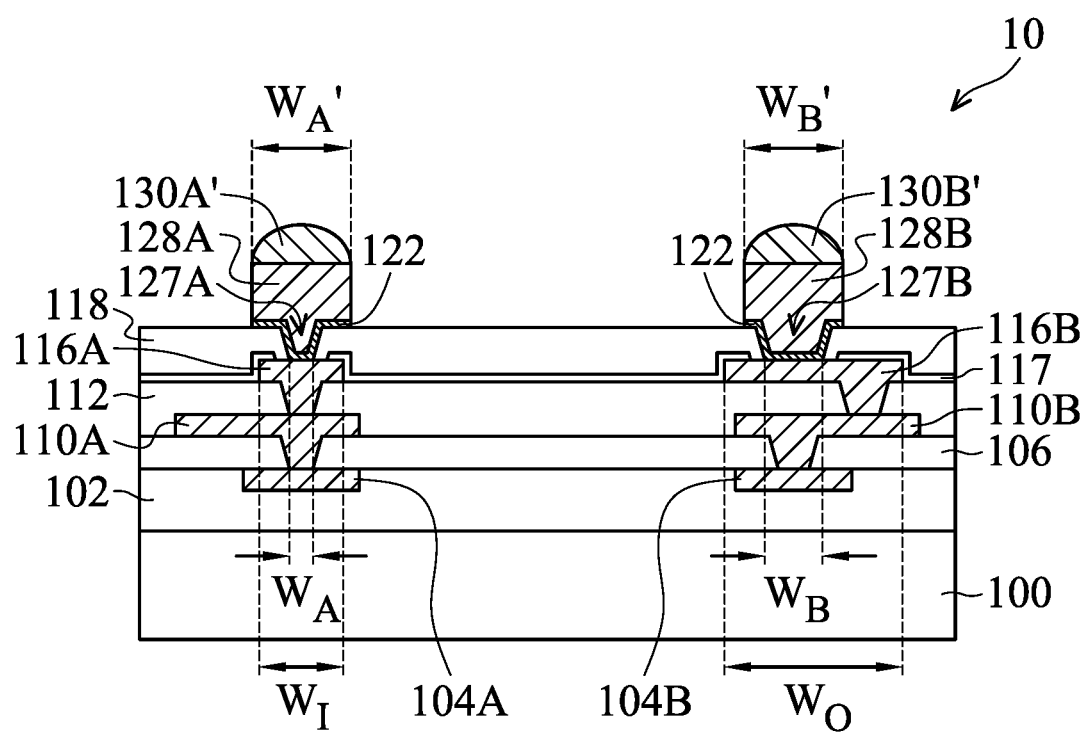
FIG. 11 is a cross-sectional view of a portion of a semiconductor device structure, in accordance with some embodiments.

Many variations and/or modifications can be made to embodiments of the disclosure. FIG. 11 is a cross-sectional view of a portion of a semiconductor device structure, in accordance with some embodiments. As mentioned above, in some embodiments, the conductive feature 116B is wider than the conductive feature 116A. As shown in FIG. 11, the conductive feature 116B (that may function as an outer conductive pad) has a width $W_O$. The conductive feature 116A (that may function as an inner conductive pad) has a width $W_I$. The width $W_O$ is greater than the $W_I$. The conductive feature 116B (that is wider) may have a greater strength to sustain higher stress at the edge region (or the outer region).

Embodiments of the disclosure form a semiconductor device structure with an inner conductive pillar and an outer conductive pillar. The inner conductive pillar is closer to the center portion (or the center point) of the semiconductor device structure, and the outer conductive pillar is closer to an edge portion of the semiconductor device structure. The inner conductive pillar and the outer conductive pillar respectively have a first protruding portion and a second protruding portion. The first protruding portion and the second protruding portion extend towards a semiconductor substrate of the semiconductor device structure. The second protruding portion is designed to be wider than the first protruding portion. The second protruding portion that is wider may help to reduce the stress near the conductive pillars that are positioned at the edge portion (and/or the corner portion) and/or help to sustain the warpage stress. Cracks and/or delamination are thus prevented or reduced. The reliability and performance of the semiconductor device structure are greatly improved.

In accordance with some embodiments, a semiconductor device structure is provided. The semiconductor device structure includes a semiconductor substrate and an interconnection structure over the semiconductor substrate. The semiconductor device structure also includes a first conductive pillar over the interconnection structure. The first conductive pillar has a first protruding portion extending towards the semiconductor substrate from a lower surface of the first conductive pillar. The semiconductor device structure further includes a second conductive pillar over the interconnection structure. The second conductive pillar has a second protruding portion extending towards the semiconductor substrate from a lower surface of the second conductive pillar. The first conductive pillar is closer to a center portion of the semiconductor substrate than the second conductive pillar. A bottom of the second protruding portion is wider than a bottom of the first protruding portion.

In accordance with some embodiments, a package structure is provided. The package structure includes a redistribution structure and a semiconductor chip bonded to the redistribution structure. The semiconductor chip includes a semiconductor substrate and an interconnection structure over the semiconductor substrate. The semiconductor chip also includes a first conductive bump over the interconnection structure, and the first conductive bump has a first protruding portion extending towards the semiconductor substrate from a lower surface of the first conductive bump. The semiconductor chip further includes a second conductive bump over the interconnection structure, and the second conductive bump has a second protruding portion extending towards the semiconductor substrate from a lower surface of the second conductive bump. The first conductive bump is closer to a center portion of the semiconductor substrate than the second conductive bump, and the second protruding portion is wider than the first protruding portion. The package structure also includes a protective layer surrounding the semiconductor chip.

In accordance with some embodiments, a method for forming a semiconductor device structure is provided. The method includes forming an interconnection structure over a semiconductor substrate. The method also includes forming a first conducive feature and a second conductive feature over the interconnection structure. The first conductive feature is closer to a center portion of the semiconductor substrate than the second conductive feature. The method further includes forming an insulating layer over the first conductive feature and the second conductive feature. In addition, the method includes forming a first opening and a second opening in the insulating layer to expose the first conductive feature and the second conductive feature. An exposed area of the second conductive feature is larger than an exposed area of the first conductive feature. The method includes forming a first conductive pillar over the first conductive feature, and the first conductive pillar extends into the first opening. The method also includes forming a second conductive pillar over the second conductive feature, and the second conductive pillar extends into the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a first conductive structure over the semiconductor substrate, wherein the first conductive structure has a first protruding portion extending towards the semiconductor substrate from a lower surface of the first conductive structure; and
   a second conductive structure over the semiconductor substrate, wherein the second conductive structure is substantially as wide as the first conductive structure, the second conductive structure has a second protruding portion extending towards the semiconductor substrate from a lower surface of the second conductive structure, the first conductive structure is closer to a center point of the semiconductor substrate than the second conductive structure, the second protruding portion is wider than the first protruding portion, and bottoms of the first protruding portion and the second protruding portion are substantially level with each other.

2. The package structure as claimed in claim 1, wherein tops of the first conductive structure and the second conductive structure are substantially level with each other.

3. The package structure as claimed in claim 1, wherein the first protruding portion has a first slanted sidewall, and the second protruding portion has a second slanted sidewall.

4. The semiconductor device structure as claimed in claim 1, further comprising:
   a third conductive structure over the semiconductor substrate, wherein the third conductive structure has a third protruding portion extending towards the semiconductor substrate from a lower surface of the third conductive structure, and the second conductive structure is between the first conductive structure and the third conductive structure.

5. The semiconductor device structure as claimed in claim 4, wherein a bottom of the third protruding portion is substantially as wide as the bottom of the second protruding portion.

6. The semiconductor device structure as claimed in claim 4, wherein a bottom of the third protruding portion is wider than the bottom of the second protruding portion.

7. The semiconductor device structure as claimed in claim 1, wherein the bottom of the first protruding portion has a first oval profile, the bottom of the first protruding portion has a first long axis, the bottom of the second protruding portion has a second oval profile, and the bottom of the second protruding portion has a second long axis.

8. The semiconductor device structure as claimed in claim 7, wherein the first long axis is substantially parallel to the second long axis.

9. The semiconductor device structure as claimed in claim 7, wherein the first long axis and the second long axis are not parallel to each other, and the first long axis and the second long axis are aligned with the center point of the semiconductor substrate.

10. The semiconductor device structure as claimed in claim 1, further comprising:
    a first conductive via between the first conductive structure and the semiconductor substrate; and
    a second conductive via between the second conductive structure and the semiconductor substrate, wherein the second conductive via is wider than the first conductive via.

11. A semiconductor device structure, comprising:
    a semiconductor substrate;
    a first conductive structure over the semiconductor substrate, wherein the first conductive structure has a first protruding portion extending towards the semiconductor substrate, and a top of the first conductive structure is wider than the first protruding portion; and
    a second conductive structure over the semiconductor substrate, wherein the second conductive structure is substantially as wide as the first conductive structure, the second conductive structure has a second protruding portion extending towards the semiconductor substrate, a top of the second conductive structure is wider than the second protruding portion, the second protruding portion is wider than the first protruding portion, and tops of the first protruding portion and the second protruding portion are substantially level with each other, wherein the first conductive structure is closer to a center portion of the semiconductor substrate than the second conductive structure.

12. The package structure as claimed in claim 11, wherein bottoms of the first protruding portion and the second protruding portion are substantially level with each other.

13. The semiconductor device structure as claimed in claim 11, further comprising:
    a first conductive via between the first conductive structure and the semiconductor substrate; and
    a second conductive via between the second conductive structure and the semiconductor substrate, wherein the second conductive via is wider than the first conductive via.

14. The semiconductor device structure as claimed in claim 13, wherein the first conductive via is directly below the first protruding portion, and the second conductive via is laterally spaced apart from the second protruding portion.

15. A semiconductor device structure, comprising:
    a semiconductor substrate;
    a first conductive structure over the semiconductor substrate, wherein the first conductive structure has a first protruding portion extending towards the semiconductor substrate, and a top of the first conductive structure is wider than the first protruding portion;
    a second conductive structure over the semiconductor substrate, wherein the second conductive structure is substantially as wide as the first conductive structure, the second conductive structure has a second protruding portion extending towards the semiconductor substrate, a top of the second conductive structure is wider than the second protruding portion, the second protruding portion is wider than the first protruding portion, and bottoms of the first protruding portion and the second protruding portion are substantially aligned with each other;
    a first conductive via between the first conductive structure and the semiconductor substrate; and
    a second conductive via between the second conductive structure and the semiconductor substrate, wherein the second conductive via is wider than the first conductive via.

16. The semiconductor device structure as claimed in claim 15, wherein the first conductive via is directly below the first protruding portion, and the second conductive via is laterally spaced apart from the second protruding portion.

17. The semiconductor device structure as claimed in claim 16, wherein the first conductive structure extends across opposite sidewalls of the first conductive via.

18. The semiconductor device structure as claimed in claim 15, wherein the first conductive via is laterally spaced apart from the first protruding portion, and the second conductive via is laterally spaced apart from the second protruding portion.

19. The semiconductor device structure as claimed in claim 11, wherein the first protruding portion has a slanted sidewall.

20. The semiconductor device structure as claimed in claim 15, wherein the first conductive structure is closer to a center portion of the semiconductor substrate than the second conductive structure.

\* \* \* \* \*